(12) United States Patent
Bertin

(10) Patent No.: US 7,525,333 B1
(45) Date of Patent: Apr. 28, 2009

(54) CURRENT SENSE CIRCUIT

(75) Inventor: Jacques J. Bertin, Pocatello, ID (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 95 days.

(21) Appl. No.: 11/356,557

(22) Filed: Feb. 17, 2006

(51) Int. Cl.
*G01R 31/26* (2006.01)

(52) U.S. Cl. ........................ 324/769; 323/315

(58) Field of Classification Search .......... 324/769; 323/313–317
See application file for complete search history.

(56) References Cited

U.S. PATENT DOCUMENTS

| | | | |
|---|---|---|---|
| 5,220,207 A | 6/1993 | Kovalcik et al. | ............ 307/350 |
| 6,465,999 B2 * | 10/2002 | D'Angelo | .................... 323/316 |
| 6,700,365 B2 * | 3/2004 | Isham et al. | ................. 323/317 |
| 6,765,412 B1 * | 7/2004 | Schottler et al. | ............... 326/83 |

* cited by examiner

*Primary Examiner*—Ha Tran T Nguyen
*Assistant Examiner*—Arleen M Vazquez
(74) *Attorney, Agent, or Firm*—Workman Nydegger

(57) ABSTRACT

A current sense circuit that measures current passing through a multi-transistor switch, each transistor in configured in parallel. The current sense circuit mirrors the current in the switch through a mirror current branch that includes a mirror transistor. The current sense circuit obtains an accurate measure of current through the switch by applying voltages at the source and/or drain terminals of the mirror transistor that more closely approximate the average source and drain terminals of the constituent transistors of the switch. Thus, relatively accurate switch current measurements may be obtained.

19 Claims, 6 Drawing Sheets

CURRENT SENSE CIRCUIT

CROSS-REFERENCE TO RELATED APPLICATIONS

Not applicable.

BACKGROUND OF THE INVENTION

Electronic circuitry provides complex functionality that is proving ever more useful. Electronic circuitry pervades our modern lives in areas such as communication, entertainment, travel, productivity, and the like. Advancements in electronic circuitry technology often translate to significant advances in quality of life.

One common type of circuit is the current sense circuit that measures the amount of current that flows through a switch. By measuring this current, the current may be regulated to be at an appropriate value given the circumstances, whether those circumstances warrant a relatively static current value, or a dynamic current value that is constantly varying in response to dynamic circumstances. For instance, when a low ohmic switch is connected to an external load, it is often desirable to have over-current protection to prevent circuit damage in case of overload. In addition to over-current protection, it would also often be advantageous to limit and/or measure the current flowing through the switch.

There are many conventional current sense circuits for measuring current flowing through a switch. FIG. 4 illustrates one conventional current sense circuit 400 in which a resistor 401 having resistance $R_{SENSE}$ is inserted in series with the switch 402 whose current is being measured. Neglecting any current leakage due to the operational amplifier 403, the current passing through the switch 402 also passes through the sense resistor 401. Thus, the voltage $V_{SENSE}$ at the positive input terminal of operational amplifier 403 is proportional to the current passing through the switch 402. The operational amplifier 403, transistor 405 and resistor 406 configured as shown cause the voltage at the upper terminal of the resistor 406 to be roughly equal to the voltage $V_{SENSE}$ at the upper terminal of the resistor 401. Thus, the current $I_{SENSE}$ that passes through the switch 405 and resistor 406 is approximately proportional to the current passing through the switch 402, thereby sensing the current passing through the switch 402.

One difficulty with the conventional current sense circuit 400 is that it uses the sense resistor 401. If the sense resistor 401 is large, the sense circuit 400 has high power dissipation, which increases the costs of using the circuit, potentially decreases its lifetime, and also can contribute to heat dissipation challenges. If the resistance of the sense resistor 401 is too low, the voltage $V_{SENSE}$ will be too low to gain an accurate current measurement.

FIG. 5 illustrates another conventional current sense circuit 500 in which the current $I_d$ through a switch 540 (also referred to as "transistor 540") is measured. This current sense circuit 500 permits current sensing without the use of an explicit resistor. Here, a mirror transistor 548 is used to generate a mirror current $I_m$ that is approximately proportional to the current $I_d$ through the switch 540. Factoring in the size ratio of the transistors 540 and 548, the current $I_d$ through the switch 540 may then be calculated based on the mirror current $I_m$. In order to support this mirroring, the voltages at the gate terminals of transistors 540 and 548 should be the same, the voltages at the source terminals of transistors 540 and 548 should be the same, and the voltages at the drain terminals of transistors 540 and 548 should be the same. This is accomplished by tying the gate terminals together, and by tying the source terminals together. The drain terminals are kept at the same voltage using the operational amplifier 556 configured with feedback provided through transistor 552 as shown.

The current sense circuit 500 does not show implicit resistances that are built into the system due to metallization resistance. For instance, the transistor terminals are connected to the rest of the circuitry using a conductive material that will have some finite resistance. Similarly, the voltages provided to the current sense circuit pass through bond wires and internal conductive material as well. Such metallization resistance may be neglected in many cases. For instance, in FIG. 5, the metallization resistance may be neglected if the current is not above certain levels. However, as the currents rise, so do the IR losses due to the implicit metallization resistances. These IR losses may cause the source voltages of transistors 540 and 548 to differ even though they are shown coupled in FIG. 5 due to the presence of perhaps different implicit resistances between the source terminals and the low voltage supply. Similarly, the drain voltages may likewise be different due to different implicit metallization resistance experienced in each current path. At some current levels, the mirroring function may break down, resulting in inaccurate current sense operation.

FIG. 6 illustrates a third conventional current sense circuit 600 in which a low ohmic switch 601 (also referred to as "large transistor 601") is composed from an array of 28 n-type field effect transistors coupled in parallel between two voltage sources labeled "Drain" and "Source". In order to accomplish the parallel configuration, the source terminals of the 28 unit transistors are coupled together, the drain terminals of the 28 unit transistors are coupled together, and the gate terminals of the 28 unit transistors are coupled together. It is known in the art that a large transistor may best be obtained by configuring a number of smaller transistors in parallel. That way, errors in one unit transistor's characteristics may be offset by errors in other unit transistors' characteristics. Furthermore, such an array may permit for certain transistor characteristics to be obtained using a smaller layout area where such characteristics are a function of the aggregated perimeter of the transistors. An extra unit transistor 602 may be used as a current mirror transistor. The gate and source terminals of the transistor 602 are coupled in common with the respect gate and source terminals of the other transistors 601. For proper matching, the transistor 602 may be laid out and fabricated in the same transistor array as the unit transistors 601.

In FIG. 6, some, but not all, of the implicit metallization resistances are illustrated within the array 601 of unit transistors. Each of the unit transistors 601 will likely experience a different source voltage, and a different drain voltage due to the presence of the metallization resistances. Accordingly, the mirror transistor 602 may draw a current $I_{SENSE}$ that is not necessarily proportional to the total current passing through the array of transistors 601.

Thus, conventional current sense circuits may not provide an accurate measure of current through a switch transistor if the currents are high. That is because when the current is high enough that there are significant IR losses due to implicit resistances in the switch, the drain and source terminals of the switch transistor may have different voltages than at the respective drain and source terminals of the mirror transistor. This might be especially true if the switch transistor is composed of an array of unit transistors thereby having significant metallization resistance within the transistor itself.

BRIEF SUMMARY OF THE INVENTION

Embodiments of the present invention relate to a current sense circuit that includes a switch that is comprised of multiple constituent field-effect transistors. The source terminals of the multiple constituent field-effect transistors are coupled together; the drain terminals of the multiple constituent field-effect transistors are coupled together; and the gate terminals of the multiple constituent field-effect transistors are coupled together. The current sense circuit is designed to measure the current through the switch by using a mirror current branch.

The mirror current branch includes a mirror transistor. Due to implicit resistances between the constituent field-effect transistors and the power sources, and amongst the constituent field-effect transistors themselves, the drain and source voltages of the constituent field-effect transistors may not be the same, even if coupled in parallel between the high and low voltage rails. For instance, such implicit resistance may be due to metallization. Such metallization resistance may result in significant variances in drain and source voltages of the constituent switch transistors. The current sense circuit obtains a more accurate measure of current through the switch by applying voltages at the source and/or drain terminals of the mirror transistor that more closely approximate the average source and drain terminals of the constituent field-effect transistors of the switch. Thus, relatively accurate switch current measurements may be obtained.

These and other features and advantages of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

Embodiments of the present invention relate to a current sense circuit that measures current passing through a multi-transistor switch, each transistor configured in parallel. The current sense circuit mirrors the current in the switch through a mirror current branch that includes a mirror transistor. The current sense circuit obtains an accurate measure of current through the switch by applying voltages at the source and/or drain terminals of the mirror transistor that more closely approximate the average source and drain terminals of the constituent transistors of the switch. Thus, relatively accurate switch current measurements may be obtained.

Figure 1:
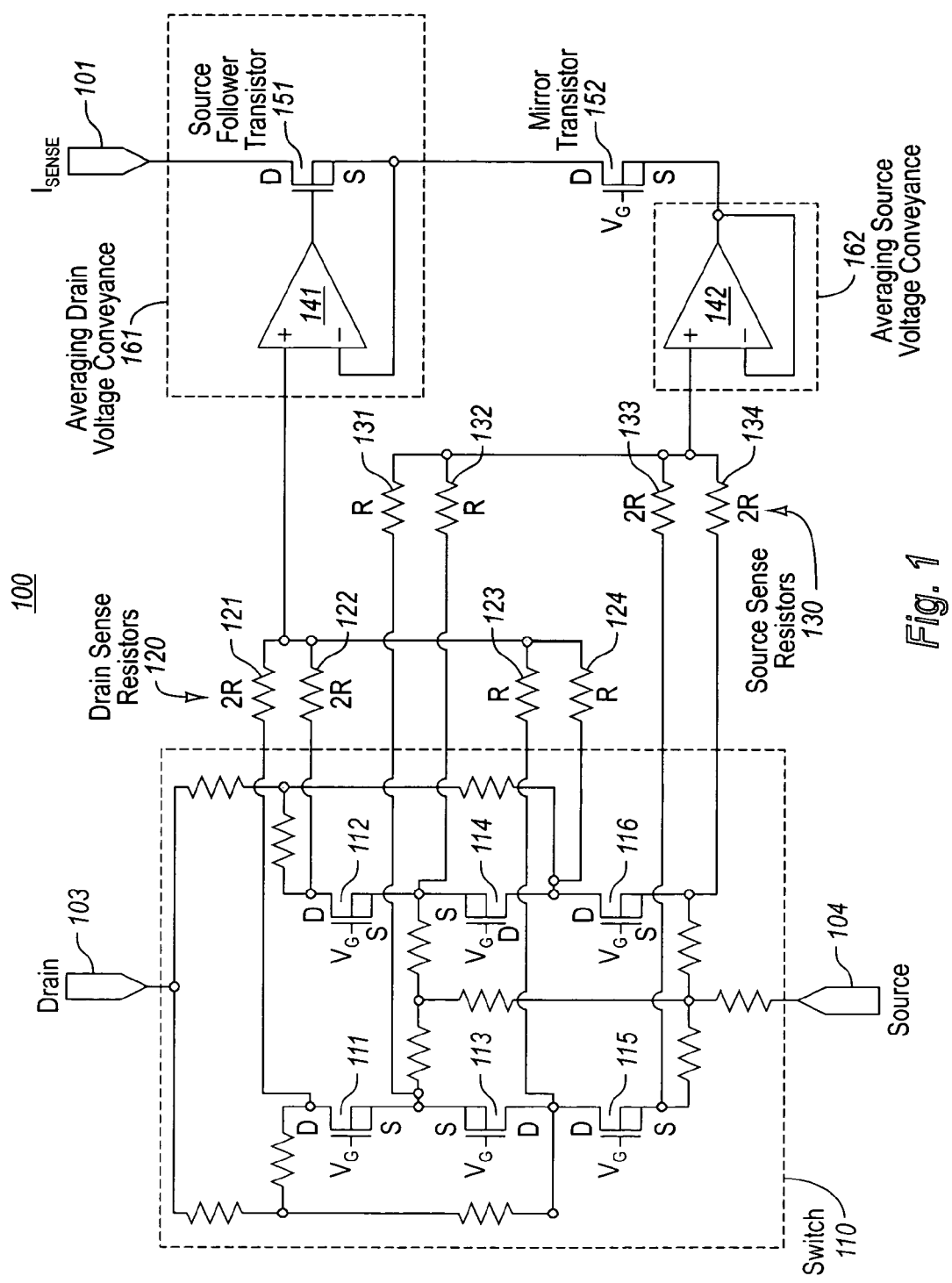
FIG. 1 illustrates a circuit diagram of a current sense circuit in accordance with the principles of the present invention in which the switch whose current is being measured includes a 2×3 array of constituent field-effect transistors.

FIG. 1 illustrates a current sense circuit 100 in accordance with one aspect of the present invention in which the current may be measured through a switch 110. The switch 110 is represented in the form of six field-effect transistors 111 through 116 configured in parallel between a collective drain terminal 103, and a collective source terminal 104. The transistors 111 through 116 are configured as a 2×3 array of transistors.

In one embodiment, the transistors 111 through 116 are approximately equally sized. In that embodiment, the transistors 111 through 116 may be referred to as "unit transistors". However, the principles of the present invention may also apply to a switch in which its constituent transistors are not similarly sized. Accordingly, the transistors 111 through 116 may be referred to hereinafter as "constituent transistors".

The constituent transistors 111 through 116 may all be p-type field-effect transistors, or they may all be n-type field-effect transistors, without limiting the principles of the present invention. Accordingly, each transistor 111 through 116 is illustrated using symbols that are ambiguous as to the polarity type of the transistors, whether they are all n-type field effect transistors, of whether they are all p-type transistors. In either case, the source terminals of each are identified with "S", and the drain terminals of each are identified with "D".

Although FIG. 1 illustrates an embodiment in which the switch whose current is to be measured is composed of six constituent transistors, the principles of the present invention are in no way limited to the number of constituent transistors in the switch. In some cases, there may be fewer constituent transistors even as few as two, but in many cases, there may be much more with theoretically no upper limit. However, in order not to obscure the principles of the present invention by using an overly complicated example, the principles of the present invention will first be introduced with respect to the current sense circuit 100 of FIG. 1 in which the switch has a manageable number of constituent transistors. Once the principles of the present invention have been described with respect to FIG. 1, the principles of the present invention may be extended to a larger switch as will be described with respect to FIG. 2. Furthermore, although the described embodiments of the present invention involve an array of constituent transistors forming the switch, there will be also be some metallization resistance regardless of the number of rows or columns in such an array. Accordingly, the principles of the present invention apply for any number of rows (one or more) in the array, and any number of columns (one or more)

in the array, and even for configurations of constituent transistors that are not in an array at all.

Referring to FIG. 1, each of the gate terminals of the constituent transistors 111 through 116 are "coupled together". In this description or in the claims, two circuit nodes are "coupled" or "coupled together" if they are either electrically connected with or without intermediate implicit or explicit resistors, or if they have disposed therebetween some mechanism which permits the voltage at each of the nodes to track each other. In FIG. 1, the gate terminals of the constituent transistors are coupled together in that they each receive approximately the same voltage $V_G$. Incidentally, as illustrated in FIG. 1, the mirror transistor 152 also have its gate terminal coupled to the gate terminal of the constituent transistors 111-116, so as to receive the same voltage $V_G$. The drain terminals of each of the constituent transistors 111 through 116 are also coupled together. To complete the parallel configuration, the source terminals of each of the constituent transistors 111 through 116 are coupled together. A resistor is "explicit" if it is designed to be part of the circuit. A resistor is "implicit" if it is not designed to be part of the circuit, but is present nonetheless due to some finite resistance of conductive materials. For instance, in FIG. 1, the resistors shown within switch 110 may be implicit resistors, although the principles of the present invention are not limited to a switch that is absent any explicit resistors. Furthermore, the resistors shown outside of the switch 110 may be explicit resistors, or perhaps even a combination of explicit and implicit resistance. For example, the size of the explicit resistor could be chosen such that the total of the series explicit and implicit resistances is equal to the desired resistance for averaging.

Figure 2:
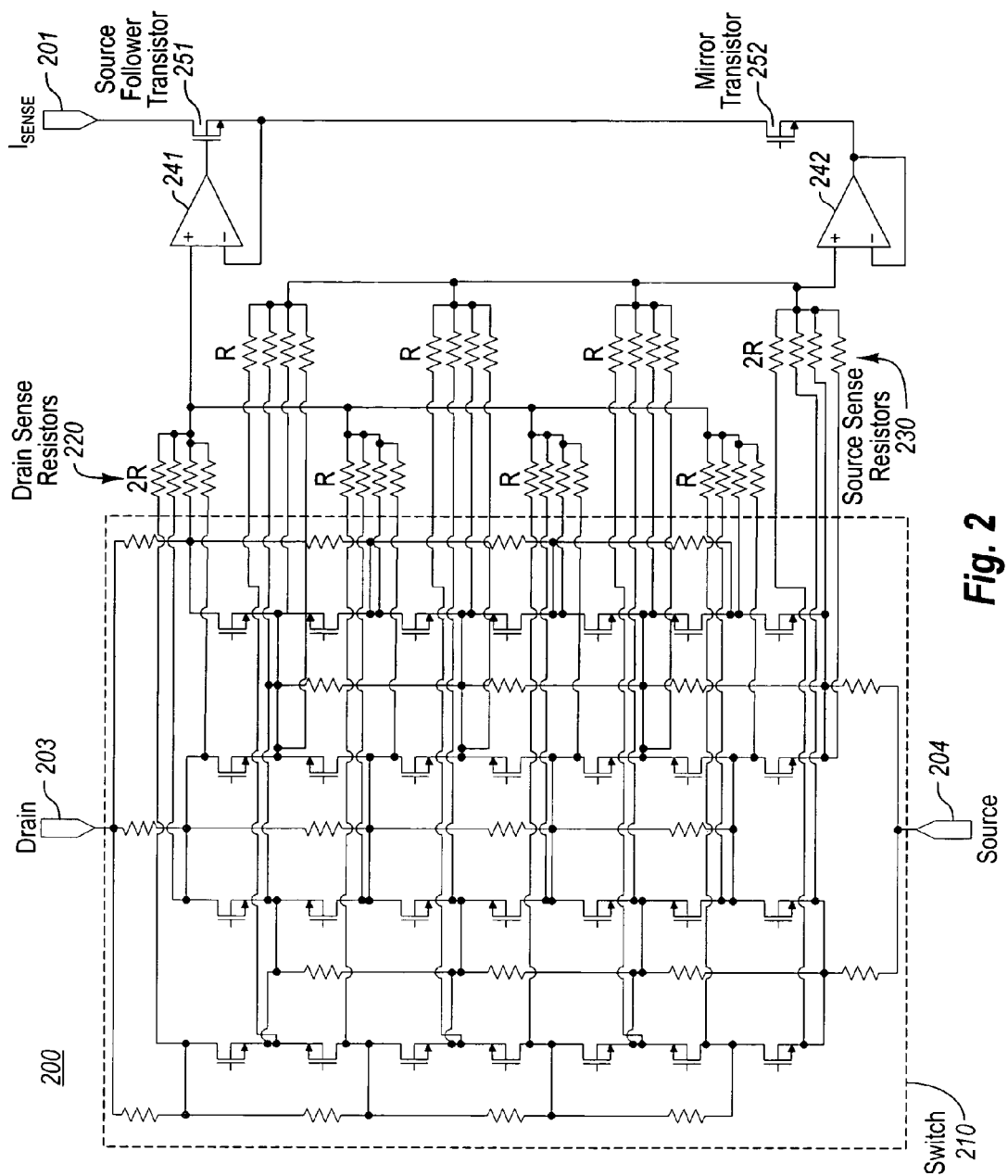
FIG. 2 illustrates a circuit diagram of a current sense circuit in accordance with the principles of the present invention in which the switch whose current is being measured includes a 4×7 array of constituent field-effect transistors.
Figure 6:
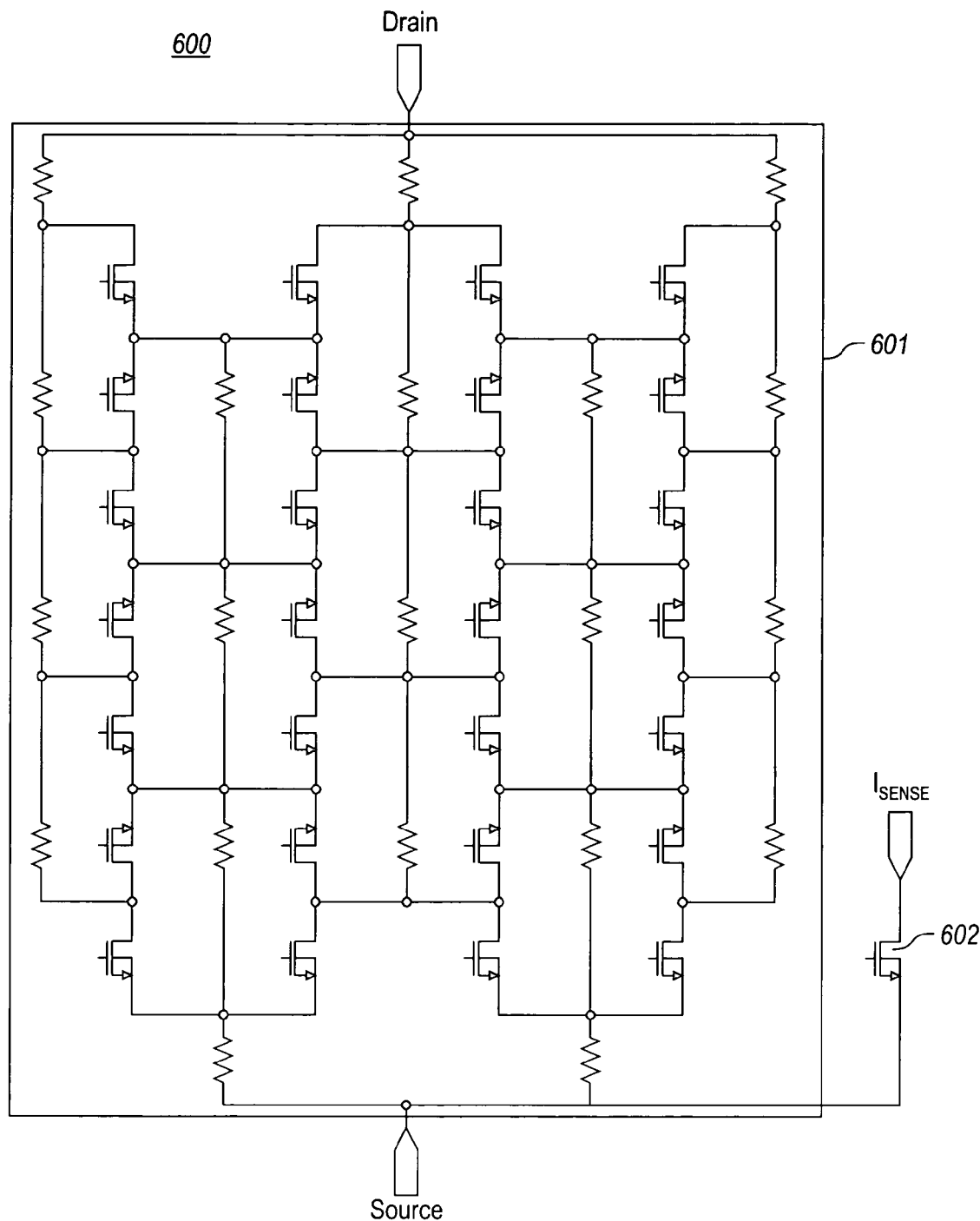
FIG. 6 illustrates a circuit diagram of a third conventional current sense circuit in accordance with the prior art in which the switch whose current is being measured includes a 4×7 array of unit transistors.

Even though configured in parallel as illustrated in FIG. 2, the drain voltages of the constituent transistors may be significantly different due to the implicit resistances shown in FIG. 1 within the switch 110. Likewise, the source voltages of the constituent transistors may differ due to the implicit resistances. Such implicit resistances might significantly reduce the accuracy in measuring the current through the switch if a convention design of FIG. 6 is employed. In contrast, the principles of the present invention provide more accurate measurements of the current through the switch by applying an "averaged" (see broad definition of "averaged" below) drain voltage to the drain terminal of the mirror transistor 152 and/or by applying an averaged source voltage to the source terminal of the mirror transistor 152.

As an example, to obtain the averaged drain voltage of the consistent transistors 111 through 116, the current sense circuit 100 includes a drain voltage averaging mechanism coupled between the drain terminals of some (or all in the case of FIG. 1) of the constituent transistors 111 through 116 and an averaging drain voltage conveyance mechanism 161. Although any mechanism for providing an "average" of the drain voltages of the constituent transistors will suffice, the drain voltage averaging mechanism is illustrated in the form of drain sense resistors 120 configured as shown in FIG. 1. Furthermore, the averaging drain voltage conveyance mechanism 161 may be any mechanism that is capable of providing an averaged drain voltage on the drain terminal of the mirror transistor 152 based on the measure average drain voltage provided by the drain voltage averaging mechanism (e.g., drain sense resistors 120). The averaging drain voltage conveyance mechanism 161 should be able to provide such a voltage without providing or drawing current to or from the drain terminal of the mirror transistor 152 at least in quantities that are significant.

In this description and in the claims, an "average" of the drain voltages need not be an exact mathematical average of the drain voltages, but may be any voltage that permits the drain-to-source voltage of the unit transistor 152 to be between the lowest drain-to-source voltage and the highest drain-to-source voltage of the constituent transistors of the switch. It is more preferred, however, if the averaging allows the drain-to-source voltage of the unit transistor 152 to be the minimum drain-to-source voltage of the constituent transistors of the switch plus 10% to 90%, or perhaps 25% to 75%, or even 40% to 60% of the difference between the minimum drain-to-source voltage and the maximum drain-to-source voltage.

In the illustrated embodiment of FIG. 1, however, an attempt to is made to configure the drain sense resistors 120 such that a relatively accurate mathematical average of the drain voltages is provided to the averaging drain voltage conveyance mechanism 161. Note that the drain sense resistors 121 and 122 are each directly coupled to a single drain terminal of a single constituent transistor. For instance, resistor 121 is directly coupled to the drain terminal of only constituent transistor 111. Likewise, resistor 122 is only directly coupled to the drain terminal of only constituent transistor 112. In contrast, the drain sense resistors 123 and 124 are each directly coupled to a shared drain terminal of two consistent transistors. For instance, resistor 123 is directly coupled to the drain terminal of both constituent transistors 113 and 115, whereas resistor 124 is directly coupled to the drain terminal of both constituent transistors 114 and 116. Accordingly, in order to obtain a relatively accurate drain voltage average, the resistors 121 and 122 may be sized to be about twice the size of the resistors 123 and 124. In this description and in the claims, a "resistor" may be a single resistor or a network of resistors (explicit and/or implicit) that provide a collective resistance between two nodes of the collective resistor. Furthermore, a resistor is "directly coupled" to another circuit node if there are no explicit resistors between the resistor and the circuit node.

In one embodiment, the averaging drain voltage conveyance mechanism 161 includes an operational amplifier 141 and a source follower transistor 151 configured as shown in FIG. 1. The operational amplifier 141 is coupled to the drain sense resistors 120 at its positive input terminal. The source follower transistor 151 receives the output of the operational amplifier 141 at its gate terminal. The drain terminal of the source follower transistor 151 is coupled to the output terminal 101 from which the sense current $I_{SENSE}$ may be detected. The source terminal of the source follower transistor 151 is coupled to the drain terminal of a mirror transistor 152, and to the negative input terminal of the operational amplifier 141. In this configuration, the averaged drain voltage of the constituent transistors 111 through 116 is provided to the drain terminal of the mirror transistor 152.

Furthering the example, to obtain the averaged source voltage of the consistent transistors 111 through 116, the current sense circuit 100 includes a source voltage averaging mechanism coupled between the source terminals of some (or all in the case of FIG. 1) of the constituent transistors 111 through 116 and an averaging source voltage conveyance mechanism 162. Although any mechanism for providing an "average" of the source voltages of the constituent transistors will suffice, the source voltage averaging mechanism is illustrated in the form of source sense resistors 130 configured as shown in FIG. 1. Furthermore, the averaging source voltage conveyance mechanism 162 may be any mechanism that is capable of providing an averaged source voltage on the source terminal of the mirror transistor 152 based on the measure average source voltage provided by the source voltage averaging mechanism (e.g., source sense resistors 130). The averaging source voltage conveyance mechanism 162 should be able to provide such a voltage without providing or drawing current to or from the source terminal of the mirror transistor 152 at least in quantities that are significant. In the illustrated embodiment, however, the averaging source voltage conveyance mechanism 162 is an amplifier 152 having its positive input terminal coupled to the source voltage averaging mechanism (e.g., source sense resistors 130), and having its output and negative input terminals coupled to the source terminal of the mirror transistor 152.

In this description and in the claims, an "average" of the source voltages also need not be an exact mathematical average of the source voltages, but may be any voltage that permits the drain-to-source voltage of the unit transistor 152 to be between the lowest drain-to-source voltage and the highest drain-to-source voltage of the constituent transistors of the switch.

In the illustrated embodiment of FIG. 1, however, like the drain voltages, an attempt to is made to configure the source sense resistors 130 such that a relatively accurate mathematical average of the source voltages is provided to the averaging source voltage conveyance mechanism 162. Note once again that the source sense resistors 133 and 134 are each directly coupled to a single source terminal of a single constituent transistor. For instance, resistor 133 is directly coupled to the source terminal of only constituent transistor 115. Likewise, resistor 134 is only directly coupled to the source terminal of the constituent transistor 116. In contrast, the source sense resistors 131 and 132 are each directly coupled to a shared source terminal of two consistent transistors. For instance, resistor 131 is directly coupled to the source terminal of both constituent transistors 111 and 113, whereas resistor 132 is directly coupled to the source terminal of both constituent transistors 112 and 114. Accordingly, in order to obtain a relatively accurate source voltage average, the resistors 133 and 134 may be sized to be about twice the size of the resistors 131 and 132. The size of the resistors may be experimented with in order to obtain a highly accurate measurement of average source voltage. If the constituent transistors were not unit transistors, the size difference might be accommodated by adjusting the size of the resistors as well.

In the example of FIG. 1, each drain terminal and each source terminal of the constituent transistor is coupled to a corresponding resistor for a more accurate drain voltage and source voltage averaging. However, depending on the need for accurate sense current measurement, fewer than all (perhaps as few as two) of the drain terminals may be sampled to obtain the drain voltage average and/or fewer than all (perhaps as few as two) of the source terminals may be sampled to obtain the source voltage average.

The embodiment of FIG. 1 could be modified to a 2×2 array of constituent transistors by removing constituent transistors 115 and 116, removing source sense resistors 133 and 134, and doubling the size of resistors 123 and 124. The embodiment of FIG. 1 could be modified to a 1×2 array of constituent transistor by removing constituent transistors 113 through 116, sense resistors 123, 124, 133 and 134. It would not be necessary to resize the resistors 131 and 132 since the ratio of the size of the source sense resistors to the size of the drain sense resistors is not an important factor in the accuracy of the current sensing operation.

FIG. 2 illustrates a more complex example in which the switch 210 includes an array of 4×7 (or 28 total) transistors. There are more drain sense transistors 220 and source sense transistors 230 to accommodate the increased number of constituent transistors although, as explained above, less than all of the drain terminals and/or source terminals may be sampled. Furthermore, each transistor is illustrated as being an n-type field effect transistor, although as explained above, they could just as well be p-type transistors. The difference there would simply be the direction of current flow between source and drain.

Figure 3A:
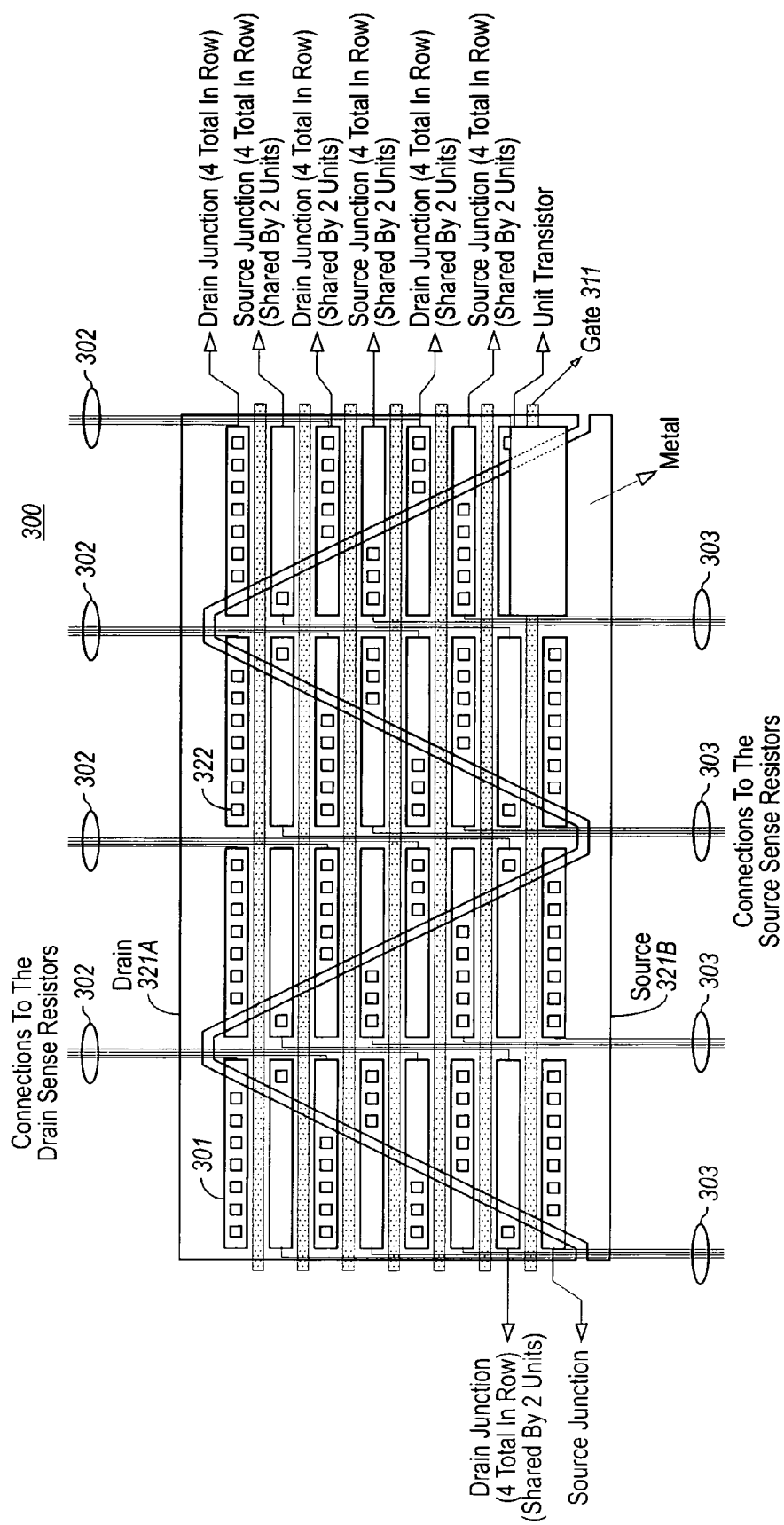
FIG. 3A illustrates an example layout of a switch that includes an array of 4×7 unit transistors that is suitable for the switch of FIG. 2.

FIG. 3A illustrates an example layout drawing 300 that may be used in fabricating the 4×7 array of constituent switches of FIG. 2. The deepest layer in the layout drawing will be the substrate itself remembering that the view of FIG. 3A is looking down from above the substrate. The substrate includes an array of 4×8 (or 32 total) active regions (one of which being labeled 301), some of which being source regions, and some of which being drain regions. An electrical connection 302 is shown connected to each of the drain active regions for connection to the drain sense resistors (not shown in FIG. 3A). Likewise, an electrical connection 303 is shown connected to each of the source action regions for connection to the source sense resistors (not shown in FIG. 3A).

Above that layer is a polysilicon gate terminal 311 that is coupled together. The polysilicon gate terminals are those seven horizontal stripes that are dot-filled. The conductive connection between the gate terminals 311 are riot shown in FIG. 3A. The polysilicon gate terminals 311 are insulated from the underlying substrate containing the active regions. Above the gate layer is a metallization layer 321 that is composed of a drain metal portion 321A and a source metal portion 321B. A recurring "V" shape gate appears in the metallization layer 321 between the drain portion 321A and the source portion 321B, and represents an electrical discontinuity between the drain portion 321A and the source portion 321B. Conductive vias (e.g. 322) represented as small black boxes electrically couple the drain portion 321A to all of the drain active regions, and couple the source portion 321B to all of the source active regions. The use of a recurring "V" shaped gap in the metallization layer permits more connection vias to be used to connect to active regions where those connections may require more current, and also permits for greater metal trace width where more current is required.

Figure 3B:
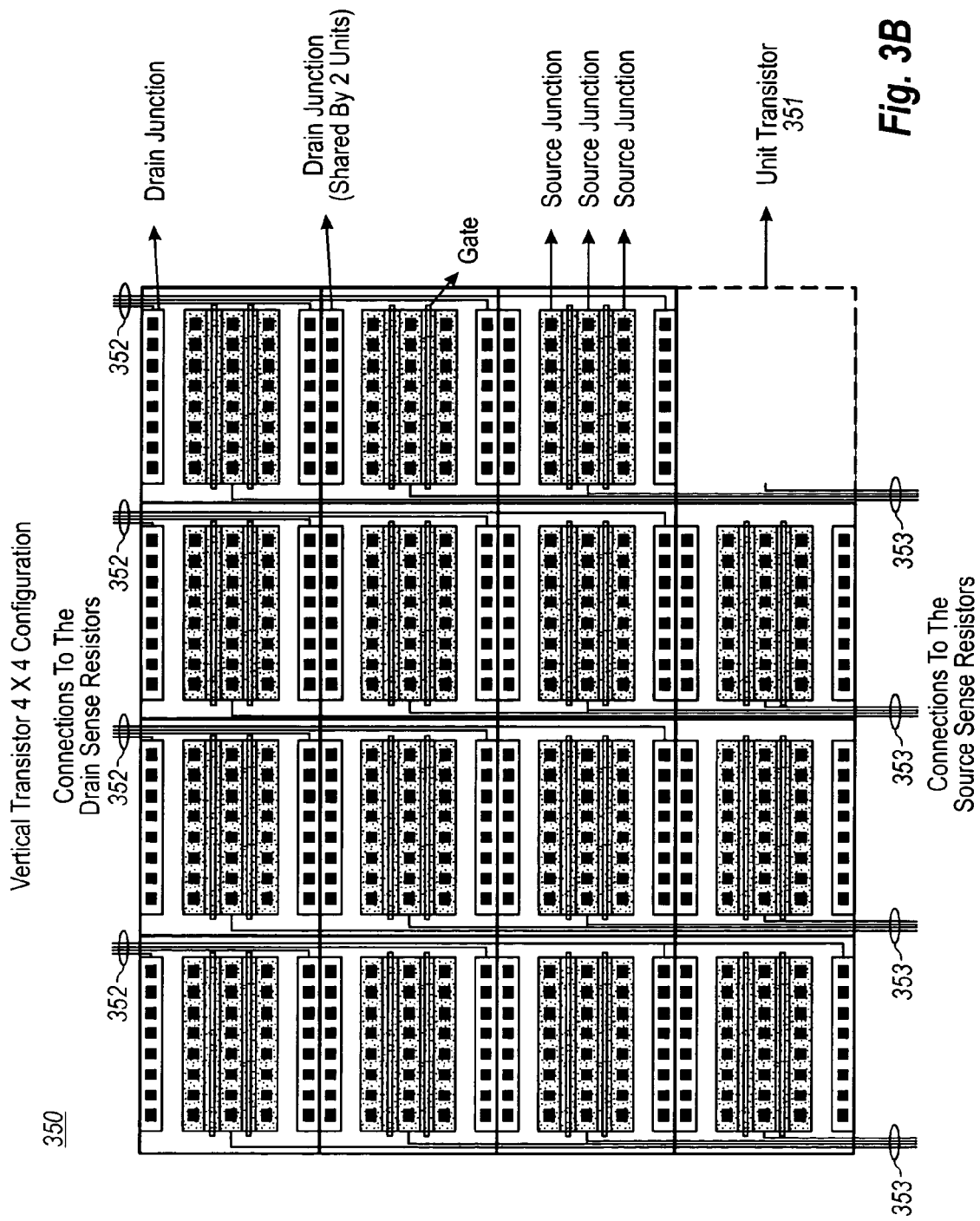
FIG. 3B illustrates an example layout of a switch that includes an array of 4×4 unit transistors, each in the form of a vertical transistor.
Figure 5:
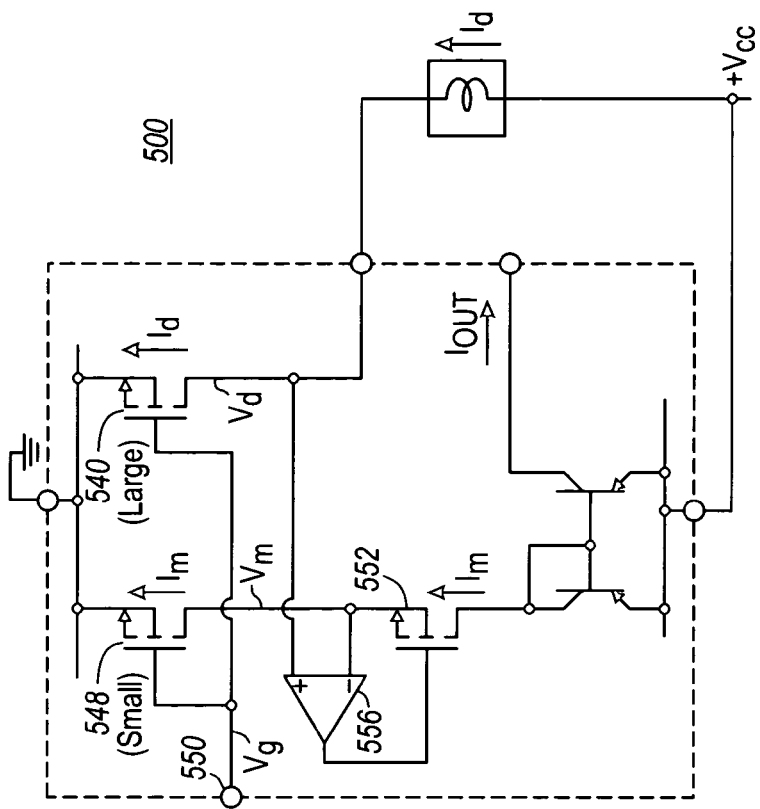
FIG. 5 illustrates a circuit diagram of a second conventional current sense circuit in accordance with the prior art.
Figure 4:
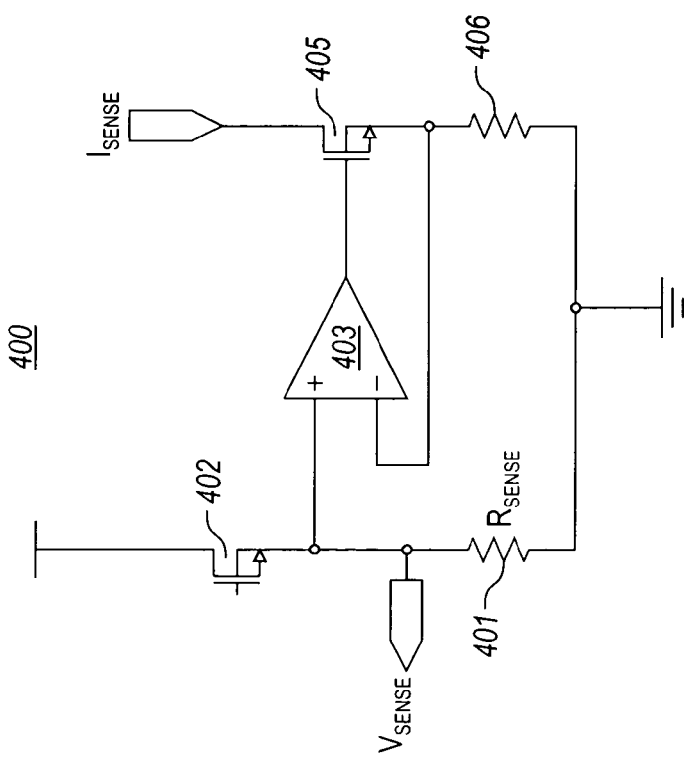
FIG. 4 illustrates a circuit diagram of a first conventional current sense circuit in accordance with the prior art.

FIG. 3B illustrates an example layout drawing 350 that may be used in fabricating a 4×4 array of constituent switches. In this embodiment, a vertical transistor configuration is used for each of the constituent switches. In a vertical transistor, there are multiple sources junctions per drain junction. For instance, in FIG. 3B, there are 3 sources and 2 drains in each unit transistor 351, and there is an array of 16 such unit transistors shown. The number of source junctions can be increased without departing from the principles of the present invention. The source regions are once again coupled (as represented by connections 353) to the source sense resistors, whereas the drain regions are once again coupled (as represented by connections 352) to the drain sense resistors. The gate terminals are present above and between the three source regions in each unit transistor.

Accordingly, the principles of the present invention provide a current sense circuit that is capable of taking highly accurate measurements of current through a switch, even if that switch is composed of multiple constituent transistors that have implicit resistances between the constituent transistors.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A current sense circuit comprising: a plurality of field-effect transistors including at least first, second, third and fourth transistors of the same polarity type, each having a source terminal, a drain terminal, and a gate terminal; the source terminals of each of the first, second, third and fourth transistors being coupled together; the drain terminals of each of the first, second, third and fourth transistors being coupled together; and the gate terminals of each of the first, second, third and fourth transistors being coupled together; an averaging drain voltage conveyance mechanism; a first drain sense resistor coupled between the drain terminal of the first transistor and the averaging drain voltage conveyance mechanism; a second drain sense resistor coupled between the drain terminal of the second transistor and the averaging drain voltage conveyance mechanism, wherein the averaging drain voltage conveyance mechanism is configured to provide an averaged drain voltage; and a mirror transistor having a source terminal, a drain terminal, and a gate terminal, wherein the gate terminal of the mirror transistor is coupled to the gate terminals of each of the first, second, third and fourth transistors, and wherein the drain terminal of the mirror transistor is coupled to the averaging drain voltage conveyance mechanism so as to receive the averaged drain voltage provided by the averaging drain voltage conveyance mechanism, the averaged drain voltage being such that the drain-to-source voltage of the mirror transistor is consistently between the highest drain-to-source voltage of the at least two of the first, second, third and fourth transistors and the lowest drain-to-source voltage of the at least two of the first, second, third and fourth transistors.

2. The current sense circuit in accordance with claim 1, the average drain voltage conveyance mechanism further comprising:
   an operational amplifier having a positive input terminal, a negative input terminal, and an output terminal, wherein the positive input terminal of the operational amplifier is coupled to the first and second resistors; and
   a source follower transistor having a source terminal, a drain terminal, and a gate terminal, wherein the source terminal of the source follower transistor is coupled to the negative input terminal of the operational amplifier and the gate terminal of the source follower transistor is coupled to the output terminal of the operational amplifier, wherein the drain terminal of the mirror transistor is coupled to the source terminal of the source follower transistor.

3. The current sense circuit in accordance with claim 2, the current sense circuit further comprising:
   an averaging source voltage conveyance mechanism;
   a first source sense resistor coupled between the source terminal of the first transistor and the averaging source voltage conveyance mechanism; and
   a second source sense resistor coupled between the source terminal of the second transistor and the averaging source voltage conveyance mechanism, wherein the averaging source voltage conveyance mechanism is configured to provide an averaged source voltage using the voltage between the first and second source sense resistors.

4. The current sense circuit in accordance with claim 3, wherein the operational amplifier is a first operational amplifier, wherein the averaging source voltage conveyance mechanism further comprises:
   a second operational amplifier having a positive input terminal, a negative input terminal, and an output terminal, wherein the positive input terminal of the second operational amplifier is coupled to the first and second source sense resistors, and wherein the source terminal of the mirror transistor is coupled to the output and negative input terminals of the second operational amplifier.

5. The current sense circuit in accordance with claim 2, wherein the polarity type of the first, second, third and fourth transistors is n-type.

6. The current sense circuit in accordance with claim 5, wherein the polarity type of the source follower and mirror transistors is also n-type.

7. The current sense circuit in accordance with claim 2, wherein the polarity type of the first, second, third and fourth transistors is p-type.

8. The current sense circuit in accordance with claim 7, wherein the polarity type of the source follower and mirror transistors is also p-type.

9. The current sense circuit in accordance with claim 1, further comprising:
   an averaging source voltage conveyance mechanism;
   a first source sense resistor coupled between the source terminal of the first transistor and the averaging source voltage conveyance mechanism; and
   a second source sense resistor coupled between the source terminal of the second transistor and the averaging source voltage conveyance mechanism, wherein the averaging source voltage conveyance mechanism is configured to provide an averaged source voltage using the voltage between the first and second source sense resistors.

10. The current sense circuit in accordance with claim 9, wherein the averaging source voltage conveyance mechanism further comprises:
    an operational amplifier having a positive input terminal, a negative input terminal, and an output terminal, wherein the positive input terminal of the operational amplifier is coupled to the first and second source sense resistors, and wherein the source terminal of the mirror transistor is coupled to the output and negative input terminals of the second operational amplifier.

11. The current sense circuit in accordance with claim 1, further comprising:
    a third drain sense resistor coupled between the drain terminal of the third transistor and the averaging drain voltage conveyance mechanism; and
    a fourth drain sense resistor coupled between the drain terminal of the fourth transistor and the averaging drain voltage conveyance mechanism.

12. The current sense circuit in accordance with claim 9, further comprising:
    a third source sense resistor coupled between the source terminal of the third transistor and the averaging source voltage conveyance mechanism; and
    a fourth source sense resistor coupled between the source terminal of the fourth transistor and the averaging source voltage conveyance mechanism.

13. The current sense circuit in accordance with claim 1, wherein the plurality of field-effect transistors further includes at least fifth through ninth transistors of the same polarity type as the first, second, third and fourth transistors, each of the fifth through ninth transistors having a source terminal, a drain terminal, and a gate terminal;
    the source terminals of each of the fifth through ninth transistors being coupled together with the source terminals of the first, second, third and fourth transistors;

the drain terminals of each of the fifth through ninth transistors being coupled together with each of the drain terminals of the first, second, third and fourth transistors; and the gate terminals of each of the fifth through ninth transistors being coupled together with each of the gate terminals of the first, second, third and fourth transistors.

14. The current sense circuit in accordance with claim 13, wherein the drain terminals of each of the fifth through ninth transistors are coupled to the averaging drain voltage conveyance mechanism each via a corresponding drain sense resistor.

15. The current sense circuit in accordance with claim 14, wherein the plurality of field-effect transistors further includes at least tenth through twentieth transistors of the same polarity type as the first, second, third and fourth transistors, each of the tenth through twentieth transistors having a source terminal, a drain terminal, and a gate terminal;

the source terminals of each of the tenth through twentieth transistors being coupled together with the source terminals of the first, second, third and fourth transistors;

the drain terminals of each of the tenth through twentieth transistors being coupled together with each of the drain terminals of the first, second, third and fourth transistors; and the gate terminals of each of the tenth through twentieth transistors being coupled together with each of the gate terminals of the first, second, third and fourth transistors.

16. The current sense circuit in accordance with claim 15, wherein the drain terminals of each of the tenth through twentieth transistors are coupled to the averaging drain voltage conveyance mechanism each via a corresponding drain sense resistor.

17. A current sense circuit comprising: a plurality of field-effect transistors including at least first, second, third and fourth transistors of the same polarity type, each having a source terminal, a drain terminal, and a gate terminal; the source terminals of each of the first, second, third and fourth transistors being coupled together; the drain terminals of each of the first, second, third and fourth transistors being coupled together; and the gate terminals of each of the first, second, third and fourth transistors being coupled together; a drain voltage averaging mechanism coupled to the drain terminals of at least two of the first, second, third and fourth transistors and configured to provide a drain voltage average for the drain terminals of the at least two of the transistors; an averaging drain voltage conveyance mechanism coupled to the drain voltage averaging mechanism so as to provide an averaged drain voltage based on the drain voltage average provided by the drain voltage averaging mechanism; and a mirror transistor having a source terminal, a drain terminal, and a gate terminal, wherein the gate terminal of the mirror transistor is coupled to the gate terminals of each of the first, second, third and fourth transistors, wherein the drain terminal of the mirror transistor is coupled to the averaging drain voltage conveyance mechanism so as to receive the averaged drain voltage provided by the averaging drain voltage conveyance mechanism, wherein the averaged drain voltage is such that the drain-to-source voltage of the mirror transistor is consistently between the highest drain-to-source voltage of the at least two of the first, second, third and fourth transistors and the lowest drain-to-source voltage of the at least two of the first, second, third and fourth transistors.

18. The current sense circuit in accordance with claim 17, the current sense circuit further comprising: a source voltage averaging mechanism coupled to the source terminals of the at least two of the first, second, third and fourth transistors and configured to provide a source voltage average for the source terminals of the at least two of the transistors; an averaging source voltage conveyance mechanism coupled to the source voltage averaging mechanism so as to provide an averaged source voltage based on the source voltage average provided by the source voltage averaging mechanism; wherein the source terminal of the mirror transistor is coupled to the averaging source voltage conveyance mechanism so as to receive the averaged source voltage provided by the averaging source voltage conveyance mechanism, wherein the averaged source voltage is such that the drain-to-source voltage of the mirror transistor is consistently between the highest drain-to-source voltage of the at least two of the first, second, third and fourth transistors and the lowest drain-to-source voltage of the at least two of the first, second, third and fourth transistors.

19. A current sense circuit comprising: a plurality of field-effect transistors including at least first, second, third and fourth transistors of the same polarity type, each having a source terminal, a drain terminal, and a gate terminal; the source terminals of each of the first, second, third and fourth transistors being coupled together; the drain terminals of each of the first, second, third and fourth transistors being coupled together; and the gate terminals of each of the first, second, third and fourth transistors being coupled together; a source voltage averaging mechanism coupled to the source terminals of at least two of the first, second, third and fourth transistors and configured to provide a source voltage average for the source terminals of the at least two of the transistors; an averaging source voltage conveyance mechanism coupled to the source voltage averaging mechanism so as to provide an averaged source voltage based on the source voltage average provided by the source voltage averaging mechanism; and a mirror transistor having a source terminal, a drain terminal, and a gate terminal, wherein the gate terminal of the mirror transistor is coupled to the gate terminals of each of the first, second, third and fourth transistors, wherein the source terminal of the mirror transistor is coupled to the averaging source voltage conveyance mechanism so as to receive the averaged source voltage provided by the averaging source voltage conveyance mechanism, wherein the averaged source voltage is such that the drain-to-source voltage of the mirror transistor is consistently between the highest drain-to-source voltage of the at least two of the first, second, third and fourth transistors and the lowest drain-to-source voltage of the at least two of the first, second, third and fourth transistors.

* * * * *

UNITED STATES PATENT AND TRADEMARK OFFICE
CERTIFICATE OF CORRECTION

PATENT NO. : 7,525,333 B1  Page 1 of 1
APPLICATION NO. : 11/356557
DATED : April 28, 2009
INVENTOR(S) : J. Bertin It is certified that error appears in the above-identified patent and that said Letters Patent is hereby corrected as shown below:

Column 1
Line 50, remove [:] after "decreases"

Column 4
Line 42, change "of" to --or--
Line 51, add --,-- after "transistors"

Column 5
Line 13, change "have" to --has--

Column 7
Line 8, change "152" to --142--
Line 21, remove [to] after "attempt"
Line 59, change "116," to --116 and--

Column 8
Line 24, change "riot" to --not--

Signed and Sealed this

Twenty-sixth Day of January, 2010

David J. Kappos
*Director of the United States Patent and Trademark Office*